US009537567B2

(12) United States Patent
Suzunaga et al.

(10) Patent No.: US 9,537,567 B2
(45) Date of Patent: Jan. 3, 2017

(54) LIGHT RECEIVING CIRCUIT AND LIGHT COUPLING DEVICE

(71) Applicant: KABUSHIKI KAISHA TOSHIBA, Tokyo (JP)

(72) Inventors: Hiroshi Suzunaga, Kitakyushu Fukuoka (JP); Shigeyuki Sakura, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 14/633,819

(22) Filed: Feb. 27, 2015

(65) Prior Publication Data

US 2016/0065150 A1 Mar. 3, 2016

(30) Foreign Application Priority Data

Aug. 27, 2014 (JP) .................................. 2014-173090

(51) Int. Cl.
*H03F 3/08* (2006.01)
*H04B 10/00* (2013.01)

(52) U.S. Cl.
CPC .............. *H04B 10/00* (2013.01); *H03F 3/082* (2013.01); *H03F 2200/78* (2013.01)

(58) Field of Classification Search
CPC ...................................... H03F 3/082
USPC ...................................... 250/214 A
See application file for complete search history.

(56) References Cited

U.S. PATENT DOCUMENTS

| 4,291,223 | A | 9/1981 | Sakane et al. |
| 7,319,365 | B2 | 1/2008 | Fujita |
| 7,755,020 | B2 | 7/2010 | Sakura et al. |
| 8,153,953 | B2 | 4/2012 | Sakura et al. |
| 8,350,206 | B2 * | 1/2013 | Stutz ................... H04B 10/693 250/208.1 |
| 2012/0068052 | A1 | 3/2012 | Sakura et al. |

FOREIGN PATENT DOCUMENTS

JP 2008-182529 A 8/2008
JP 2014209700 A 11/2014

* cited by examiner

*Primary Examiner* — Thanh Luu
(74) *Attorney, Agent, or Firm* — Patterson & Sheridan, LLP

(57) ABSTRACT

A light receiving circuit includes an inverting amplification circuit, a first light receiving element, a first circuit, and a charging circuit. The inverting amplification circuit includes an input terminal and an output terminal. The first light receiving element is connected between the input terminal and a reference potential terminal. The first circuit includes a first resistor, a second resistor, a third resistor and a capacitor. The first resistor second resistor connected through a connection point. The first resistor is connected between the input terminal and the connection point, and the second resistor connected between the output terminal and the connection point. The third resistor is connected between the connection point and connection node, and the capacitor is connected between the connection node and the reference potential terminal. The charging circuit connected between the power supply terminal and the connection node.

20 Claims, 12 Drawing Sheets

LIGHT RECEIVING CIRCUIT AND LIGHT COUPLING DEVICE

CROSS-REFERENCE TO RELATED APPLICATION

This application is based upon and claims the benefit of priority from Japanese Patent Application No. 2014-173090, filed Aug. 27, 2014, the entire contents of which are incorporated herein by reference.

FIELD

Embodiments described herein relate generally to a light receiving circuit and a light coupling device.

BACKGROUND

In recent years, in devices such as a light coupling element and a light data link, the light emitting efficiency of the light emitting element has improved, and transmission loss in the plastic fiber which forms the light transmission line has also decreased. For this reason, by using such a device, it is possible to perform a high capacity and low cost light data communication. In such a light data communication environment, a dynamic range of a light receiving circuit could be improved though it would still be necessary to maintain a stable operation in this wider operation range.

The strength of the light signal to be transmitted in these devices varies in a range from a very low level to a very high level due to variations in the transmission distance of a light transmission line, and thus expansion of a dynamic range of a light receiving circuit within these devices becomes a significant issue. For example, in a light receiving circuit that includes a light receiving element and a trans-impedance amplifier (TIA) at an input stage, a very weak signal can be received and accommodated by setting the gain of the trans-impedance amplifier to a high level. However, if the gain is set too high, a strong signal which may also be received by the light receiving element could cause the trans-impedance amplifier to be saturated, whereby a waveform of an output signal from the trans-impedance amplifier is distorted. For this reason, an incorrect output signal from the trans-impedance amplifier can be generated, and thus, the potential incoming signal strength has to be decreased in such a device.

DETAILED DESCRIPTION

An example embodiment provides a light receiving circuit and a light coupling device in which an incorrect output is decreased and a stable operation is achieved.

In general, according to one embodiment, a light receiving circuit includes an inverting amplification circuit, a first light receiving element, a first circuit, and a charging circuit. The inverting amplification circuit includes an input terminal and an output terminal. The first light receiving element is connected between the input terminal and a reference potential terminal. The first circuit includes a first resistor, a second resistor, a third resistor and a capacitor. The first resistor second resistor connected through a connection point. The first resistor is connected between the input terminal and the connection point, and the second resistor connected between the output terminal and the connection point. The third resistor is connected between the connection point and connection node, and the capacitor is connected between the connection node and the reference potential terminal. The charging circuit is connected between the power supply terminal and the connection node.

Hereinafter, embodiments will be described with reference to the drawings.

First Embodiment

Figure 1:
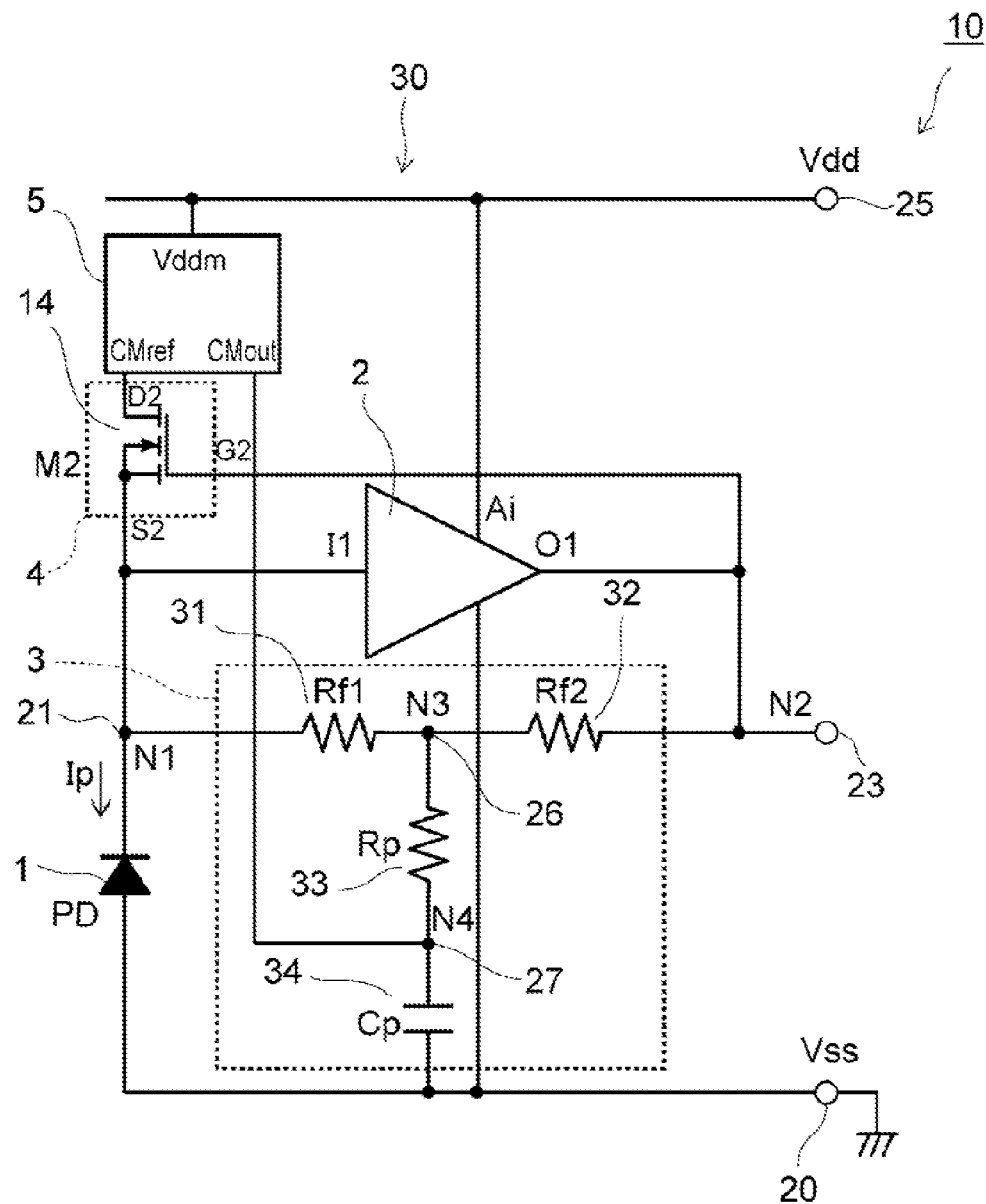
FIG. 1 is a circuit diagram illustrating a light receiving circuit according to a first embodiment.

FIG. 1 is a circuit diagram illustrating a light receiving circuit according to the first embodiment.

As illustrated in FIG. 1, a light receiving circuit 10 according to the first embodiment includes a light receiving element 1 (PD), an inverting amplification circuit 2 (Ai), a feedback circuit 3, a limiter circuit 4, and a current mirror circuit 5. In the embodiments described below, the limiter circuit and the current mirror circuit together form a charging circuit. The light receiving circuit 10 is connected between a reference potential 20 and a power supply potential 25. The reference potential 20 is the lowest potential among the potentials to which the light receiving circuit 10 is connected, and typically is a ground potential, that is, 0 V. The power supply potential 25 is the highest potential among the potentials to which the light receiving circuit 10 is connected, for example, 3.3 V. The reference potential 20 and the power supply potential 25 may maintain the above-described potential relationship, and in some embodiments both or one of the reference potential 20 and the power supply potential 25 may be a negative potential.

The light receiving element 1 is connected between the reference potential 20 and an input node 21 (N1) to which an output current Ip of the light receiving element 1 is input. The light receiving element 1 is, for example, a silicon photo diode. In addition to a silicon photo diode, the light receiving element 1 may be another photoelectric conversion element, such as a silicon PIN photo diode, or an avalanche photo diode. The device chosen as the light receiving element 1 can depend on an expected light transmission distance, an intended communication speed or the like. Furthermore, material of the light receiving element 1 is not limited to silicon.

The inverting amplification circuit 2 includes an input terminal I1 that is connected to the input node 21, and an output terminal O1 that is connected to an output node 23 (N2). The inverting amplification circuit 2 performs inverting amplification of a voltage that is input to the input terminal I1, and outputs an amplified voltage to the output terminal O1.

The feedback circuit 3 includes a first resistor element 31 (Rf1), a second resistor element 32 (Rf2), a third resistor element (Rp) 33, and a capacitor 34 (Cp). The first resistor element 31 and the second resistor element 32 are connected in series to each other between input node 21 (N1) and output node 23 (N2), and thus the series-connected resistor elements 31 and 32 are connected in parallel to the inverting amplifier circuit 2 between the input terminal I1 and the output terminal O1. The third resistor element 33 and the capacitor 34 are connected in series to each other. The resistor element 33 is also connected to a connection node 26 (N3) that is a connection point between the first resistor element 31 and the second resistor element 32. The capacitor 34 is also connected to a terminal to be used for the reference potential 20.

The inverting amplification circuit 2 to which the feedback circuit 3 is connected forms a trans-impedance amplification circuit 30 in which an amount of feedback is changed by a frequency of the current input to the inverting amplification circuit 2. If a current that is input to the input terminal I1 is referred to as I1, and a voltage that is output from the output terminal O1 is referred to as VO1, a trans-impedance Z is represented as follows.

$$Z=VO1/I1$$

$$VO1/I1=(Rf1+Rf2)\cdot\{1+j\omega Cp(Rp+Rf1\cdot Rf2)/(Rf1+Rf2)\}/(1+j\omega CpRp) \quad (1)$$

For a low frequency (low w value) input signal to the inverting amplification circuit 2, the impedance of the capacitor 34 (i.e., Cp) is large, and the trans-impedance is determined by a serial resistance (Rf1+Rf2) of the first resistor element Rf1 and the second resistor element Rf2. On the other hand, for a high frequency signal (high w value) in which the impedance of the capacitor 34 (i.e., Cp) is small, the trans-impedance is determined by (Rf1+Rf2)+Rf1·Rf2/Rp. That is, in the light receiving circuit 10, the trans-impedance Z is changed by the frequency of a signal that is input.

The limiter circuit 4 includes a limiter transistor 14 (M2) that has a gate terminal G2 (control terminal) which is connected to the output node 23, and a source terminal S2 (first main terminal) which is connected to the input node 21. A drain terminal D2 (second main terminal) of the limiter transistor 14 is connected to a reference current setting terminal CMref of the current mirror circuit 5. The limiter transistor 14 is, for example, an N channel MOSFET.

The limiter circuit 4 detects a voltage at both ends of the serial resistor formed from both the first resistor element 31 and the second resistor element 32. If the voltage at both ends of the serial resistor reaches a threshold voltage of the limiter transistor 14, the limiter transistor 14 turns on and clamps the voltage at both ends of the serial resistor formed from both the first resistor element 31 and the second resistor element 32. For this reason, the voltage VO1 that is output from the output terminal O1 of the inverting amplification circuit 2 does not rise to a level higher than the threshold voltage of the limiter transistor 14, and the output of the inverting amplification circuit 2 is prevented from saturating.

The limiter circuit 4 may include a resistor element that is connected between the source terminal (S2) of the limiter transistor 14 and the input node 21. By inserting such a resistor element, the impedance of the limiter transistor 14 is prevented from rapidly decreasing, and the voltage VO1 that is output from the output terminal O1 may be prevented from saturating in a more stable manner.

The current mirror circuit 5 has a power supply terminal Vddm that is connected to a terminal for the power supply potential 25. The current mirror circuit further includes a reference current setting terminal CMref and a current output terminal CMout. The current mirror circuit 5 receives power from the power supply potential 25, and sets the reference current Iref to be supplied to the reference current setting terminal CMref. The current mirror circuit 5 sets an output current Iout based on the reference current Iref. The reference current setting terminal CMref is connected to the drain terminal D2 of the limiter transistor 14. The current output terminal CMout is connected to a connection node 27 (N4) that is a connection point between the third resistor element 33 and the capacitor 34 which are connected in series to the feedback circuit 3 as described above. The output current Iout may be k times the value of the reference current Iref. Here, k is an arbitrary positive number.

The light receiving element 1 is driven in a pulse shape (e.g., an incident light signal on the photodiode varies in amplitude), and outputs the first current Ip with a corresponding pulse shape. The light receiving element 1 receives the light pulse signal and generates the output current Ip with a pulse shape. The generated output current Ip flows into the feedback circuit 3 via the input node 21.

More specifically, in a case of an input signal level which does not result in the limiter circuit 4 operating, as the output current Ip rises, the potential at the connection node 26 rises, and a current flows to charge the capacitor 34 from the connection node 26 via the third resistor element 33 is added to the output current Ip and flows through the second resistor element 32. This additional current causes a voltage at the output node 23 of the inverting amplification circuit 2 to deflect more on a positive side. As the capacitor 34 is charged, the potential at the connection node 27 increases, the voltage at the output node 23 decreases, and the output voltage according to the trans-impedance Z of Formula (1) is output. That is, when the output current Ip increases, the voltage VO1 at the output node 23 is output as a voltage in which an overshoot voltage Vos=(Rf1+Rf2)/Rp)×Ip is added to the output voltage ((Rf1+Rf2)×Ip) resulting in increased trans-impedance Z.

If an amount of received light of the light receiving element 1 is zero, the output current Ip becomes zero after a falling time dependent on the characteristics of the light receiving element 1. The electric charges that are charged in the capacitor 34 are discharged into the connection node 26 via the third resistor element 33. For this reason, the voltage at the output node 23 of the inverting amplification circuit 2 deflects more toward a negative side. As the electric charges that are charged in the capacitor 34 are discharged, the voltage at the output node 23 is output as an output voltage with a low level that is determined by a circuit configuration of the inverting amplification circuit 2. That is, when the output current Ip decreases, the voltage VO1 at the output node 23 is output as a voltage which is lowered by an undershoot voltage Vus from a minimum value of the output voltage VO1. At this time, even if the light receiving element 1 (PD) has delay current components, such as a diffusion current generated by light carriers occurring at an area deep from the surface of the light receiving element 1, undershoot may be generated by appropriately setting values of Cp and Rp. For this reason, it is possible to prevent a circuit connected to a subsequent stage from unintended activation.

As described above, if a light signal that is received by the light receiving element 1 is not strong, the voltage output from the light receiving circuit 10 is output as a voltage to which an overshoot voltage Vos is added when the output current Ip increases, and output as a voltage from which the undershoot voltage Vus is subtracted when the output current Ip decreases. The overshoot voltage Vos and the undershoot voltage Vus are determined by charging and discharging time of the capacitor 34 in the feedback circuit 3.

If intensity of the light received by the light receiving element 1 is stronger, then the limiter circuit 4 can be activated. Similar to the manner described above for the lower intensity light signal, as the output current Ip of the light receiving element 1 increases, the voltage at the output node 23 increases. After a high enough output current Ip flows, the voltage at both ends of the serial resistor of the first resistor element 31 and the second resistor element 32 in the feedback circuit 3 exceeds the threshold voltage of the limiter transistor 14, whereby the limiter transistor 14 turns on. A current flowing through the limiter transistor 14 becomes the reference current Iref of the current mirror circuit 5. The current mirror circuit 5 outputs the output current Iout that is k times the reference current Iref, thereby charging the capacitor 34. The output current Iout of the current mirror circuit 5 charges the capacitor Cp, flows into the input node 21 from the first resistor element 31 via the third resistor element 33, and also flows into the second resistor element 32.

Then, if the amount of received light becomes zero, the output current Ip that is output from the light receiving element 1 decreases. At the time of light received becoming zero, discharging of the electric charges accumulated in the capacitor 34 occurs and the potential at the output node 23 generates undershoot. At the time of light receiving, the limiter transistor 14 operates and voltage rising at the output node 23 is limited, whereby the potential at the connection node 26 becomes an intermediate potential between the potential at the input node 21 and the potential at the output node 23. For this reason, if there is no current injection from the current mirror circuit 5, the electric charges that are charged in the capacitor 34 decrease, and the undershoot voltage Vus that is determined by the quantity of electric charges thereof also decreases.

Here, if the light receiving element 1 is a silicon photo diode and receives near infrared light, a diffusion length of a photo-excited carriers is long, i.e. around 100 μm, and thus a long time, for example, about several hundred ns is required until a light current is extinguished after the amount of received light becomes zero. A current caused by extinguishing time of the carriers is called a trailing current. If the output current Ip of the light receiving element 1 is large, a peak value of the output current Ip is limited by the limiter circuit 4, whereby a ratio of trailing current components with respect to the output current Ip after being limited by the limiter circuit 4 becomes larger than a ratio with respect to a peak value before being limited by the limiter circuit 4. For example, if the ratio of trailing current components with respect to the peak value of the output current Ip before being limited by the limiter circuit 4 is 5%, and the peak value thereof is limited to a quarter of the current value by the limiter circuit 4, then in the output node 23 of the inverting amplification circuit 2, the ratio of trailing current components with respect to the peak value after being limited, is increased up to 20% of the current value—that is, four times the current value before being limited. If the undershoot voltage is low and falling time is short due to undershoot, the trailing current components remain after undershoot is ended. If an output waveform generated by the remaining trailing current components exceeds the threshold value of the comparator in a subsequent stage, there is a possibility that an unintended activation is contained in the output of the comparator.

In the light receiving circuit 10, the current mirror circuit 5 charges the capacitor 34 during operation of the limiter circuit 4. For this reason, the electric charges in the capacitor 34 increase, whereby when the output falls, it is possible to continue to discharge the capacitor 34. Even if the output current Ip on the input node 21 side shows a slow trailing waveform, the discharge of the capacitor 34 makes it is possible to generate a sufficiently large undershoot voltage Vus at the output node 23. As described above, in the light receiving circuit 10 according to the present embodiment, the voltage VO1 at the output node 23 falls to a sufficient voltage within time to prevent unintended activation of a circuit after the light receiving circuit 10.

Second Embodiment

Figure 2:
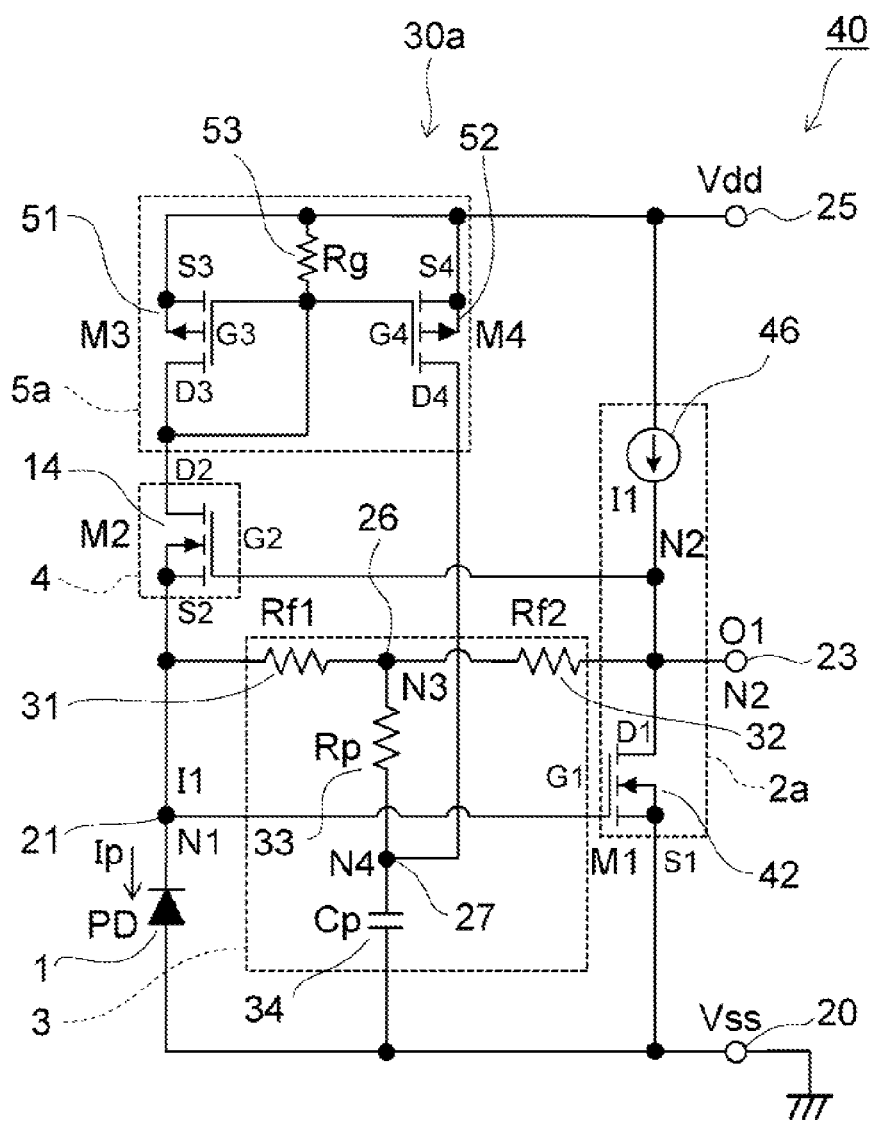
FIG. 2 is a circuit diagram illustrating a light receiving circuit according to a second embodiment.

FIG. 2 is a circuit diagram illustrating a light receiving circuit according to a second embodiment.

Figure 3:
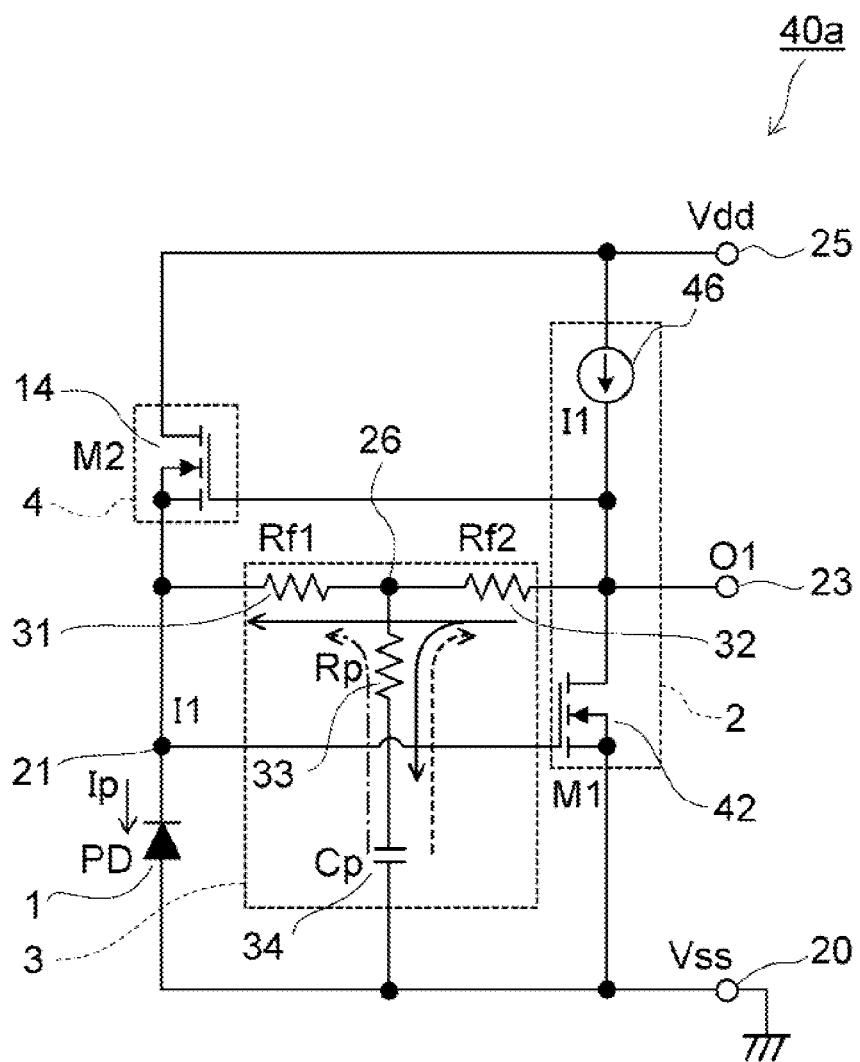
FIG. 3 is a circuit diagram for illustrating a comparison example to the second embodiment.

FIG. 3 is a circuit diagram for explaining an operation of a light receiving circuit according to a comparison example to the second embodiment.

As illustrated in FIG. 2, a light receiving circuit 40 according to the second embodiment is different from the light receiving circuit 10 according to the first embodiment in that an inverting amplification circuit 2a includes a source ground amplification circuit which is configured with a MOSFET, and the current mirror circuit 5 includes a current mirror circuit 5a which is configured with MOSFETs. Hereinafter, the same symbols or reference numerals as used in the light receiving circuit 10 according to the first embodiment are attached to the same circuit elements and connections, and detailed description of these same circuit elements and connections will be omitted.

The inverting amplification circuit 2a includes an inverting amplification transistor 42 (M1) and a load circuit 46 (I1). The inverting amplification transistor 42 includes a source terminal that is connected to the reference potential 20, a gate terminal that is connected to the input node 21, and a drain terminal that is connected to the output node 23. The load circuit 46 is connected between the power supply potential 25 and the output node 23. The load circuit 46 operates when a current flows through the inverting amplification transistor 42. The inverting amplification transistor 42 performs inverting amplification of a voltage signal at the input node 21 and outputs the amplified signal to the output node 23. The load circuit 46 is not limited to a current source, and may be a resistor element. The feedback circuit 3 is connected between the input terminal I1 of the inverting amplification circuit 2a and the output terminal O1, and the inverting amplification circuit 2a and the feedback circuit 3 form a trans-impedance amplification circuit 30a.

The current mirror circuit 5a includes a reference current setting transistor 51 (M3) and a current output transistor 52 (M4). The reference current setting transistor 51 has a source terminal S3 that is connected to the power supply potential 25 and a gate terminal G3 that is connected to a drain terminal D3 thereof. The current output transistor 52 includes a source terminal S4 that is connected to the power supply potential 25, a gate terminal G4 that is connected to the gate terminal G3 of the reference current setting transistor 51, and a drain terminal D4 that outputs an output current Iout based on the reference current Iref flowing through the reference current setting transistor 51. The drain terminal D3 of the reference current setting transistor 51 is connected to the drain terminal D2 of the limiter transistor 14, and the drain terminal D4 of the current output transistor 52 is connected to the connection node 27 that is a connection point of the third resistor element 33 and the capacitor 34 of the feedback circuit 3. When a ratio of a transistor size of the reference current setting transistor 51 and a transistor size of the current output transistor 52 is referred to as k, the output current Iout may be k times (k>0) the reference current Iref. That is, by appropriately selecting transistor sizes in the current mirror circuit 5a, it is possible to easily set the output current Iout that charges the capacitor Cp. A P channel MOSFET, for example, can be used to for each transistor that connects the current mirror circuit 5a between the power supply potential 25 and another circuit element. In addition, in order to stably operate the current mirror circuit 5a, it is preferable that a shunt resistor 53 be connected between the gates and sources of the reference current setting transistor 51 and the current output transistor 52.

FIG. 3 illustrates a light receiving circuit 40a as a comparison example to compare with the light receiving circuit 40, and may also be compared with the light receiving circuit 10. As illustrated in FIG. 3, the light receiving circuit 40a according to the comparison example is different from the light receiving circuit 40 in that the light receiving circuit 40a does not include the current mirror circuit 5a. Hereinafter, the same symbols or reference numerals as in the light receiving circuit 40 are attached to the same circuit elements and connections as in the light receiving circuit 40a, and detailed description thereof will be omitted.

The light receiving circuit 40a according to the comparison example includes the light receiving element 1 (PD), the inverting amplification circuit 2a, the feedback circuit 3, and the limiter circuit 4. The inverting amplification circuit 2a includes the inverting amplification transistor 42 and the load circuit 46 that are included in the source ground amplification circuit. In the same manner as in the second embodiment, the feedback circuit 3 includes the first resistor element 31 (Rf1), the second resistor element 32 (Rf2), the third resistor element (Rp) 33, and the capacitor 34 (Cp). The first resistor element 31 and the second resistor element 32 are connected in series, and are connected between the input terminal I1 of the inverting amplification circuit 2a and the output terminal O1. The third resistor element 33 and the capacitor 34 are connected in series, and are connected at one end to the connection node 26 that is a connection point between the first resistor element 31 and the second resistor element 32, and at the other end to the reference potential 20.

An operation of the light receiving circuit 40a according to the comparison example will now be described.

An operation in a case where an amount of received light of the light receiving element 1 is small results in a similar operation to when an amount of received light of the light receiving circuit 10 according to the first embodiment is small.

Conversely, if the light receiving element 1 receives a large light signal, then when the output current Ip rises, the output current Ip, as denoted by the arrow of a solid line of FIG. 3, flows so as to charge the capacitor 34 along a path including the second resistor element 32 and the third resistor element 33. At this time, the output current Ip flows along a path including the first resistor element 31 and the second resistor element 32, and if a voltage at both ends of the first resistor element 31 and the second resistor element 32 exceeds the threshold voltage of the limiter transistor 14, the limiter transistor 14 turns on. For this reason, if the light receiving element 1 outputs the output current Ip with a high level, a voltage that is clamped by the limiter transistor 14 is output.

If an amount of the received light at the light receiving element 1 becomes zero, the electric charges that are charged in the capacitor 34 of the feedback circuit 3, as denoted by the arrow of a dashed line of FIG. 3, are discharged into the inverting amplification transistor 42 via the second resistor element 32. For this reason, the voltage VO1 that is output from the output node 23 causes the undershoot voltage Vus.

Here, if the light receiving element 1 is a silicon photo diode, and receives near infrared light, a diffusion current flows for several 100 ns, and a so-called trailing current is generated. During a period when a diffusion current flows through the light receiving element 1, as denoted by an alternate long and short dash line in FIG. 3, the electric charges that are charged in the capacitor 34 flow into not only the output node 23 side but also a path discharging into the light receiving element 1 side via the first resistor element 31. For this reason, the time for discharging the electric charges accumulated in the capacitor 34 into the output node 23 side cannot be sufficiently maintained making it difficult to generate a sufficient undershoot voltage Vus on the output node 23 side.

In contrast to this, in the light receiving circuit 40 according to the second embodiment, sufficient electric charges are charged into the capacitor 34 from the current mirror circuit 5a, and thus it is possible to secure a sufficient voltage through discharge into the light receiving element 1 side via the first resistor element 31. As the sufficient electric charges that are charged in the capacitor 34 are discharged, the undershoot voltage of the output node 23 may be secured. Thus, in the light receiving circuit 40, it is possible to prevent a circuit that is connected to a subsequent stage from unintended activation or the like.

Third Embodiment

Figure 4:
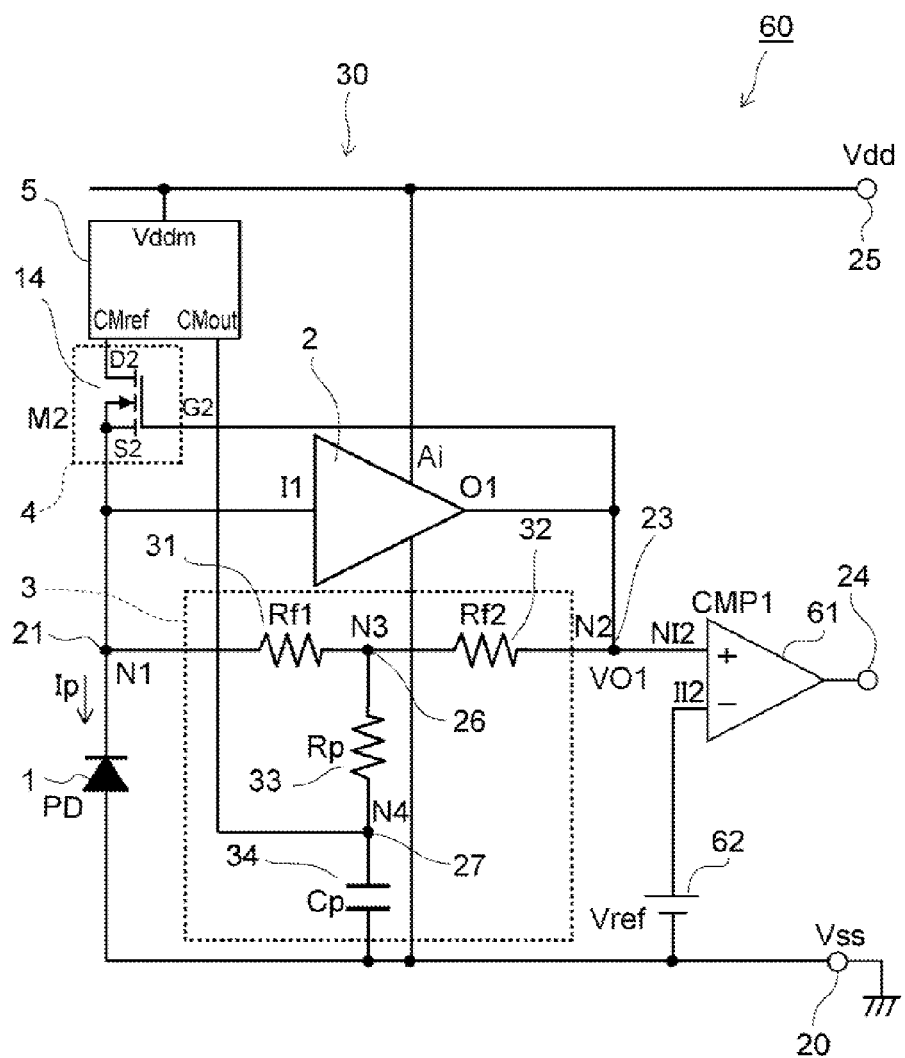
FIG. 4 is a circuit diagram illustrating a light receiving circuit according to a third embodiment.

FIG. 4 is a circuit diagram illustrating a light receiving circuit according to a third embodiment.

Figure 5:
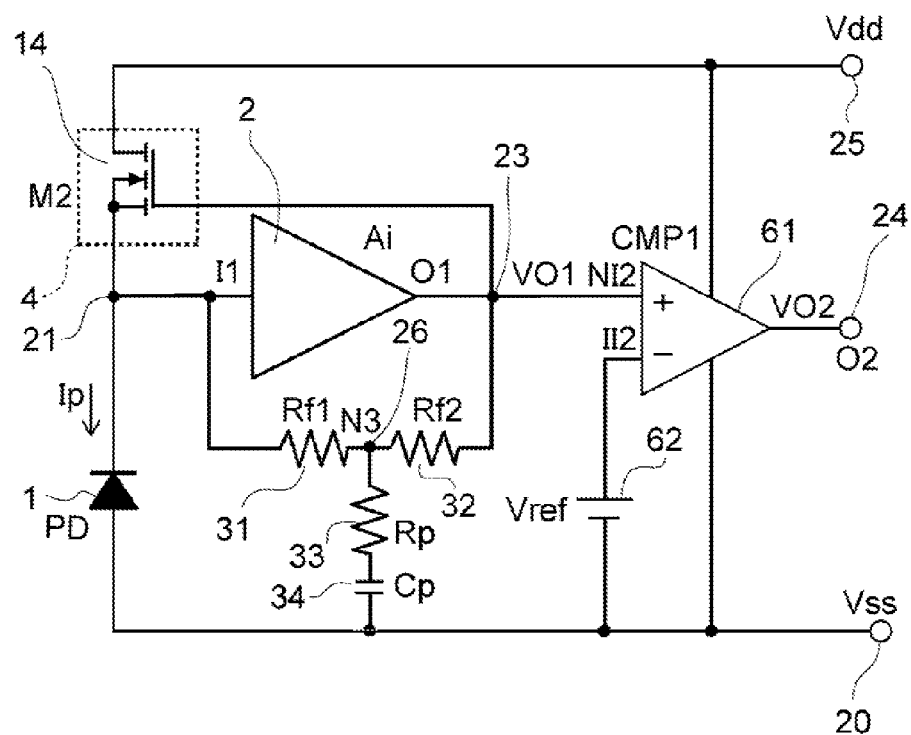
FIG. 5 is a circuit diagram illustrating a light receiving circuit according to a comparison example to the third embodiment.

FIG. 5 is a circuit diagram illustrating a light receiving circuit according to a comparison example to the third embodiment.

Figure 6A:
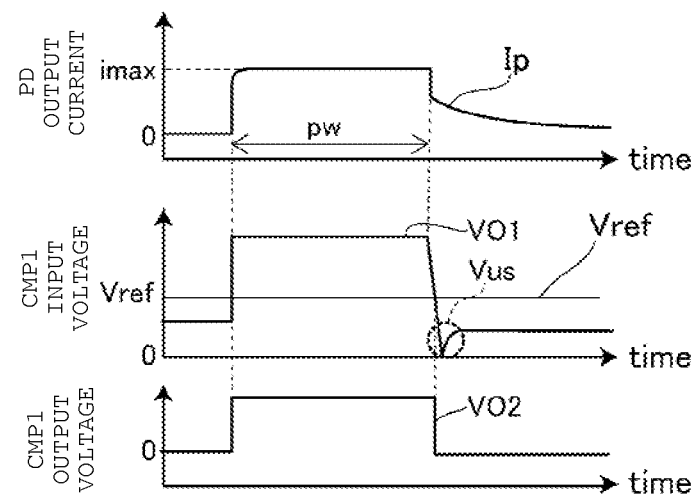
FIG. 6A is an operation waveform diagram for an operation of the light receiving circuit according to the third embodiment.
Figure 6B:
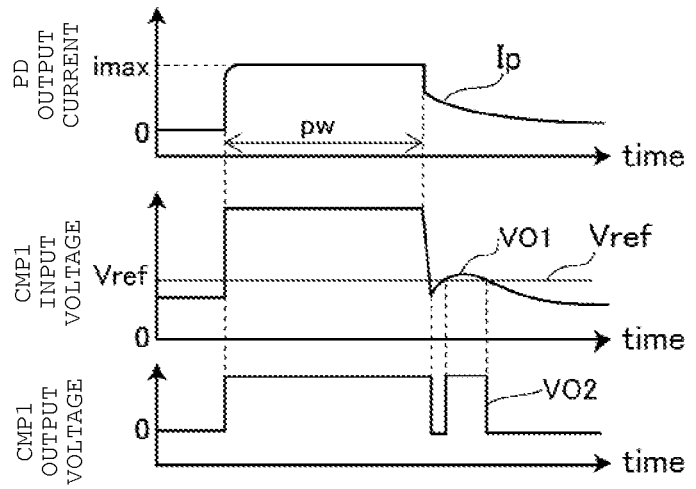
FIG. 6B is an operation waveform diagram for an operation of the light receiving circuit according to the comparison example to the third embodiment.

FIG. 6A is an operation waveform diagram for explaining operation of the light receiving circuit according to the third embodiment. FIG. 6B is an operation waveform diagram for explaining operation of the light receiving circuit according to the comparison example to the third embodiment.

As illustrated in FIG. 4, a light receiving circuit 60 according to the third embodiment is different from the light receiving circuit 10 in that the light receiving circuit 60 includes a comparator 61 having a non-inverting input terminal (+) connected to the output node 23, and a reference power supply circuit 62 that is connected to an inverting input terminal (−) of the comparator 61. Hereinafter, the same symbols or reference numerals as in the light receiving circuit 10 according to the first embodiment are attached to the same circuit elements and connections as in the light receiving circuit 60, and detailed description thereof will be omitted.

The light receiving circuit 60 includes the comparator (CMP1) and the reference power supply circuit 62. The comparator 61 includes a non-inverting input terminal NI2 (+) that is connected to the output node 23, and an inverting input terminal II2 (−). The reference power supply circuit 62 is connected to the inverting input terminal II2 of the comparator 61 so as to apply a reference voltage Vref. The comparator 61 compares the voltage VO1 at the output node 23 with the reference voltage Vref, and if the voltage VO1 is higher than the reference voltage Vref, the comparator 61 outputs an output voltage VO2 with a high level to an output 24. If the voltage VO1 is lower than the reference voltage Vref, the comparator 61 outputs an output voltage with a low level to the output 24. A logic of the output of the comparator 61 can be set by a circuit that is connected to the comparator 61. For example, if the inverting input terminal II2 is connected to the output node 23 of the trans-impedance amplification circuit 30, and the non-inverting input terminal NI2 is connected to the reference power supply circuit 62, it is possible to obtain an output signal of a logic contrary to the above described case.

In the light receiving circuit 60, even if the light receiving element 1 receives so large a light signal as to operate the limiter circuit 4, the current mirror circuit 5 operates by means of the limiter circuit 4, whereby the capacitor 34 is charged with a sufficiently high voltage. Thus, even if an amount of the received light is zero and a trailing current generated by a diffusion current or the like flows through the light receiving element 1, a sufficient undershoot voltage is generated in the voltage VO1 at the output node 23, whereby the voltage VO1 due to the trailing current is prevented from rising. For this reason, it is difficult for the comparator 61 to perform unintended activation.

As illustrated in FIG. 5, a light receiving circuit 60a according to the comparison example is different from the light receiving circuit 60 in that the light receiving circuit 60a does not include the current mirror circuit 5. Hereinafter, the same symbols or reference numerals as in the light receiving circuit 60 according to the third embodiment are attached to the same circuit elements and connections as in the light receiving circuit 60a, and detailed description thereof will be omitted.

In the light receiving circuit 60a according to the comparison example, if an amount of the received light of the light receiving element 1 is increased, whereby the voltage that is generated at both ends of the serial resistor of the first and second resistor elements 31 and 32 exceeds the threshold voltage of the limiter transistor 14, the limiter transistor 14 turns on. At this time, if an amount of the received light becomes zero, the light receiving element 1 generates a long trailing current. The light receiving circuit 60a discharges the electric charges that are charged in the capacitor 34 via the second resistor element 32, and thus the potential at the output node 23 generates the undershoot and then decreases. However, the electric charges in the capacitor 34 are discharged into the light receiving element 1 side via the first resistor element 31, and thus it is difficult to generate a sufficient undershoot voltage Vus at the output node 23.

The upper graph of each of FIGS. 6A (third embodiment) and 6B (comparison embodiment) illustrates a waveform of the output current Ip that is output from the light receiving element 1. A middle graph of each of FIGS. 6A and 6B illustrates waveforms, which are overlapped with each other, of the voltages VO1 and Vref that are input to the comparator 61. A lower graph of each of FIGS. 6A and 6B illustrates a waveform of the voltage VO2 that is output from the output 24 of the comparator 61 according to the respective embodiments.

As illustrated in FIG. 6A, in the light receiving circuit 60, when the output current Ip of the light receiving element 1 falls, the capacitor 34 in the feedback circuit 3 is sufficiently charged by the current mirror circuit 5 that operates in conjunction with the operation of the limiter circuit 4, whereby the undershoot voltage Vus is generated in the voltage VO1 at the output node 23, as illustrated in a dashed line circle of FIG. 6A. For this reason, the output voltage VO1 of the light receiving circuit 60 sharply falls. The output voltage VO1 stays below the reference voltage Vref helping to provide correct comparator CMP1 operation. Thus, in the light receiving circuit 60, even if the output current Ip with a large amplitude is input, the output voltage VO1 does not rise by a trailing waveform, and it is possible to prevent the comparator in a subsequent stage from unintended activation or the like.

As illustrated in FIG. 6B, in the light receiving circuit 60a according to the comparison example, the undershoot of the voltage VO1 at the output node 23 is not sufficiently generated. The trailing current components of the output current Ip are not sufficiently discharged and appear as an output waveform similar to that of the trailing current after a small undershoot voltage is generated. The output voltage VO1 can rise above the reference voltage Vref causing incorrect comparator CMP1 operation. If the voltage VO1 that is undershot crosses a threshold voltage given as the reference voltage Vref once, and thereafter crosses again the threshold voltage, the comparator 61 outputs an incorrect pulse as shown in the lower graph of FIG. 6C.

Fourth Embodiment

Figure 7:
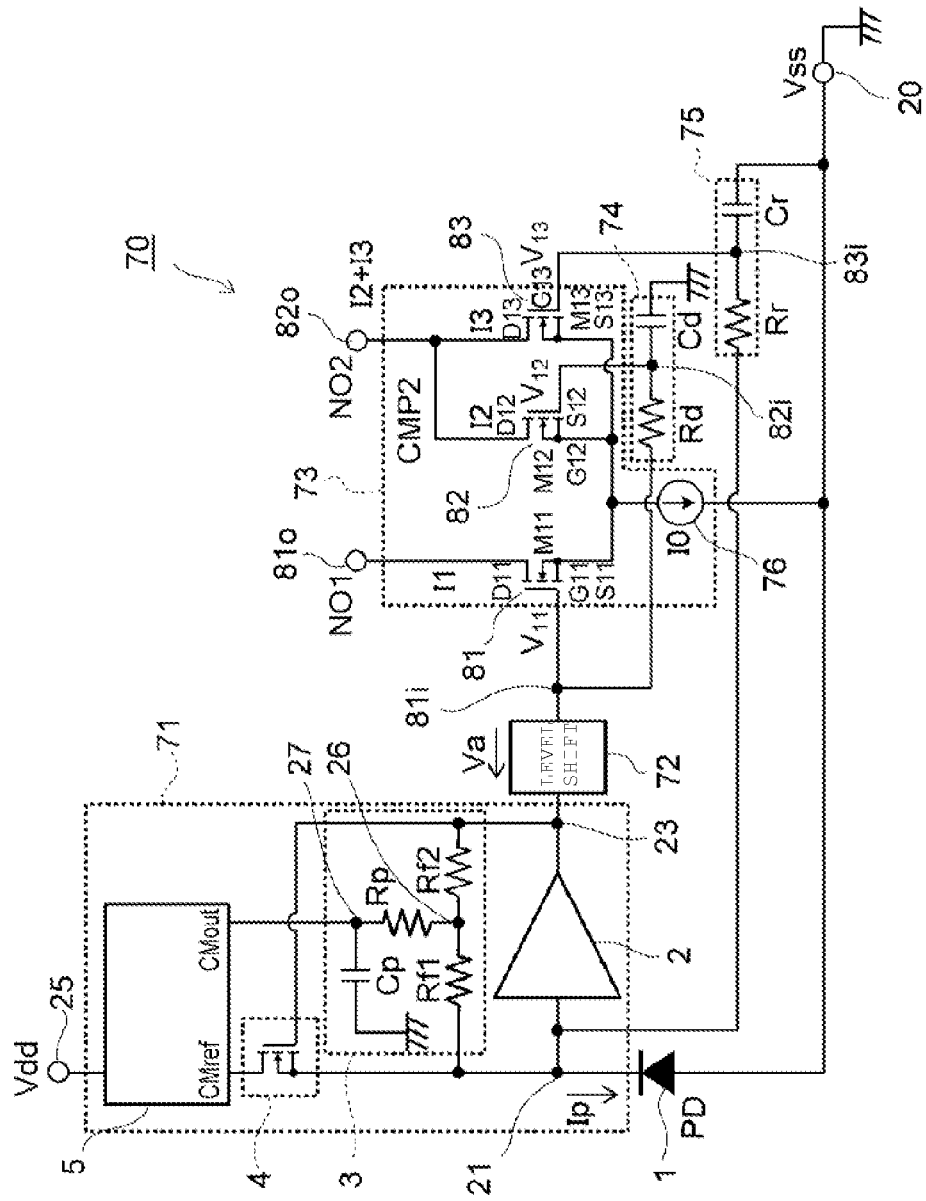
FIG. 7 is a circuit diagram illustrating a light receiving circuit according to a fourth embodiment.

FIG. 7 is a circuit diagram illustrating a light receiving circuit according to a fourth embodiment.

Figure 8:
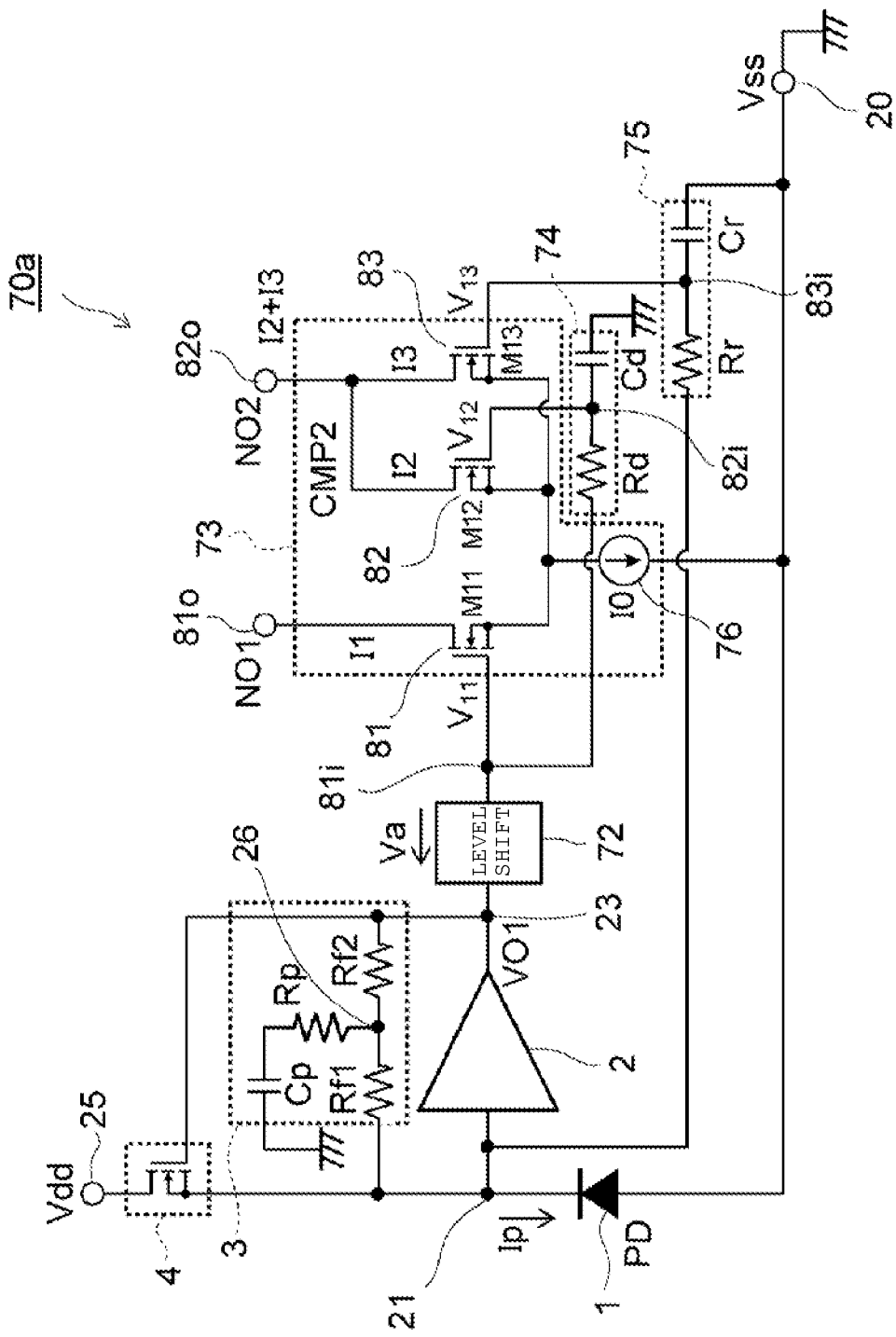
FIG. 8 is a circuit diagram illustrating a light receiving circuit according to a comparison example to the fourth embodiment.

FIG. 8 is a circuit diagram illustrating a light receiving circuit according to a comparison example to the fourth embodiment.

Figure 9A:
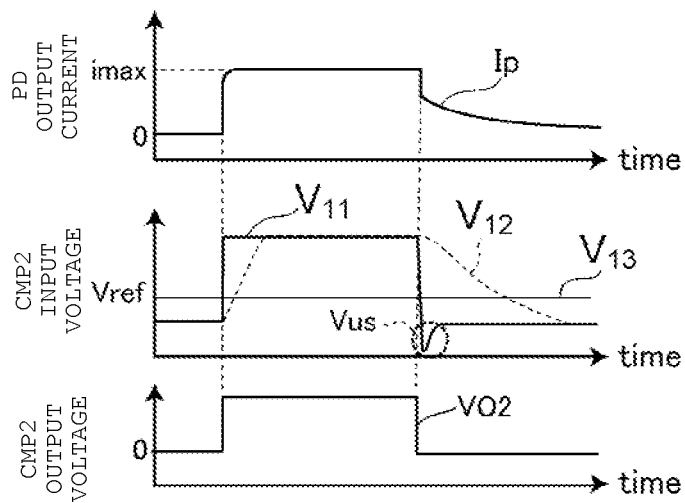
FIG. 9A is an operation waveform diagram for an operation of the light receiving circuit according to the fourth embodiment.
Figure 9B:
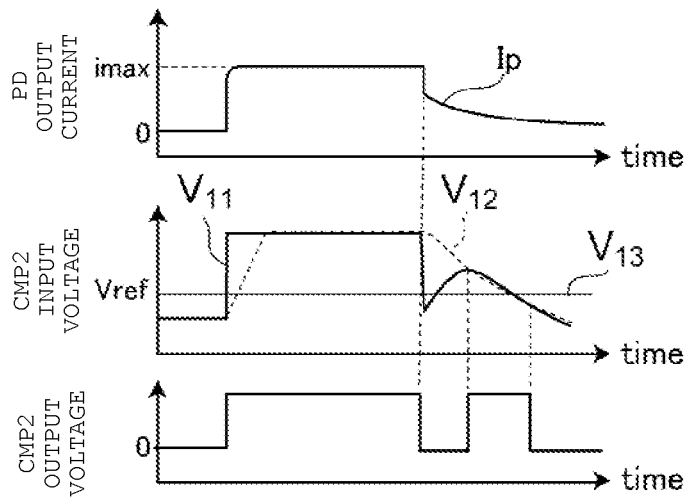
FIG. 9B is an operation waveform diagram for an operation of the light receiving circuit according to the comparison example to the fourth embodiment.

FIG. 9A is an operation waveform diagram for explaining operation of the light receiving circuit according to the fourth embodiment. FIG. 9B is an operation waveform diagram for explaining an operation of the light receiving circuit according to the comparison example to the fourth embodiment.

As illustrated in FIG. 7, a light receiving circuit 70 according to the fourth embodiment is different from the light receiving circuit 10 in that the light receiving circuit 70 includes a comparator including three input transistors which are connected to the output node 23 via a level shift circuit. Hereinafter, the same symbols or reference numerals as in the light receiving circuit 10 according to the first embodiment are attached to the same circuit elements and connections as in the light receiving circuit 70, and detailed description thereof will be omitted.

The light receiving circuit 70 according to the fourth embodiment includes the light receiving element 1, a trans-impedance amplification circuit 71, a level shift circuit 72, a comparator 73, a delay circuit 74, and a reference power supply circuit 75.

The trans-impedance amplification circuit 71 that is connected to the light receiving element 1 is substantially the same as that in the light receiving circuit 10. The level shift circuit 72 is connected between the output node 23 of the trans-impedance amplification circuit 71 and an input of the comparator 73, and is connected to a first input terminal 81i of the comparator 73. The level shift circuit 72 shifts a range of the voltage VO1 that is output from the output node 23 to a negative side by a level shift voltage Va. The level shift voltage Va provides a threshold value current ith with respect to the output current Ip of the light receiving element 1 and inverts an output of the comparator 73 depending on whether or not the output current Ip exceeds the threshold value ith.

The delay circuit 74 is a time constant circuit that is configured with a capacitor Cd and a resistor Rd which are connected in series. The delay circuit 74 is connected between an output of the level shift circuit 72 and the reference potential 20. A connection point between the capacitor Cd and the resistor Rd is connected to a second input terminal 82i. The delay circuit 74 inputs the output voltage from the level shift circuit 72, generates a signal that is delayed, and inputs the delayed signal to the comparator 73.

The reference power supply circuit 75 is a time constant circuit that is configured with a capacitor Cr and a resistor Rr which are connected in series. The reference power supply circuit 75 is connected between the input node 21 and the reference potential 20. A connection point between the capacitor Cr and the resistor Rr is connected to a third input terminal 83i. A time constant of the reference power supply circuit 75 is sufficiently large, as compared to a frequency of the light signal input to the light receiving element 1, and the reference power supply circuit 75 supplies a substantially constant voltage with respect to the variation of the input node 21 to the third input terminal 83i of the comparator 73. In addition in some embodiments, if the gain of the inverting amplification circuit 2 is sufficiently large, and an input impedance of the input node 21 is sufficiently small, there is little potential variation of the input node 21, whereby the capacitor Cr and the resistor Rr may not be connected necessarily to each other.

The comparator 73 includes three input transistors 81 to 83, and a current source 76. The three input transistors 81 to 83 are, for example, N channel MOSFETs. A gate terminal G11 of the first input transistor 81 is connected to the level shift circuit 72 via the first input terminal 81i. A drain terminal D11 of the first input transistor 81 is connected to a first current output terminal 81o. A gate terminal G12 of the second input transistor 82 is connected to the delay circuit 74 via a second input terminal 82i. A gate terminal G13 of the third input transistor 83 is connected to the reference power supply circuit 75 via a third input terminal 83i. The drain terminals D12 and D13 of the second and third input transistors 82 and 83 are connected to each other, and connected to a second current output terminal 82o. Source terminals S11 to S13 of the first to third input transistors 81 to 83 are connected to each other. The current source 76 is connected to the source terminals S11 to S13 of the first to third input transistors 81 to 83 and the reference potential 20.

In the comparator 73, a transistor size of the first input transistor 81 is the same as the sum of the transistor sizes of the second input transistor 82 and the third input transistor 83. Here, it is assumed that if the input transistor is a MOSFET, the transistor size is represented by a gate width/a gate length. If the transistor is a bipolar transistor, then a transistor size can represented by a base-emitter junction area. For the MOSFET size, if a gate width and a gate length of the first input transistor 81 are referred to as W1 and L1, respectively, and a gate width and a gate length of the second input transistor 82 are referred to as W2 and L2, respectively, and a gate width and a gate length of the third input transistor 83 are referred to as W3 and L3, respectively, Formula (2) is represented as follows.

$$W1/L1 = W2/L2 + W3/L3 \qquad (2)$$

Here, a current flowing through the first input transistor 81 is referred to as I1, a current flowing through the second input transistor 82 is referred to as I2, a current flowing through the third input transistor 83 is referred to as I3, and the output current of the light receiving element 1 in which I1=I2+I3 is referred to as a threshold value ith.

If a light current equal to or more than the threshold value ith flows through the light receiving element 1 and if a light current less than the threshold value ith flows, magnitudes of the output currents at the first current output terminal 81o and the second current output terminal 82o are inverted, in the comparator 73. In this way, the light receiving circuit 70 may obtain an output signal with a little distortion with respect to a pulse width PW of the output current Ip, which flows through the input node 21, of the light receiving element 1. In addition, by satisfying Formula (2), the threshold value ith is maintained substantially constant regardless of temperature.

When the above-described comparator 73 is connected to an output side of the trans-impedance amplification circuit 71, even though a trailing current is generated for a relatively long time when the light signal is deactivated after a current signal has been generated by a large light signal that activated the limiter circuit 4, the undershoot is generated when the voltage at the output node 23 falls, whereby it is possible to prevent the output of the comparator 73 from unintended activation.

As illustrated in FIG. 8, the light receiving circuit 70a according to the comparison example is different from the light receiving circuit 70 acc in that a trans-impedance amplification circuit 30b does not include the current mirror circuit 5.

When the light signal becomes zero, the light receiving circuit 70a according to the comparison example generates a long trailing current from the light receiving element 1. Since the undershoot that is generated by the electric charges accumulated in the capacitor 34 of the feedback circuit 3 is not sufficient, the output voltage from the level shift circuit 72 to the comparator 73 rises, whereby there is a possibility that the comparator 73 outputs an incorrect pulse.

An upper graph of each of FIGS. 9A and 9B illustrates a waveform of the output current Ip that is output from the light receiving element 1. A middle graph of each of FIGS. 9A and 9B illustrates waveforms, which are overlapped with each other, of the voltages V11 to V13 that are input to the comparator 73. A lower graph of each of FIGS. 9A and 9B illustrates waveforms of the voltages that are output from the outputs NO1 and NO2 of the comparator 73.

As illustrated in FIG. 9A, in the light receiving circuit 70 according to the fourth embodiment, a sufficient undershoot is generated at the output node 23 of the trans-impedance amplification circuit 71, and the voltage at the output node 23 rapidly falls, whereby it is possible to prevent the output of the comparator 73 from unintended activation.

In contrast to this, as illustrated in FIG. 9B, in the light receiving circuit 70a according to the comparison example, even though the undershoot is generated once in the waveform of the trailing current of the light receiving element 1 at the input node 21 and the output is inverted, the trailing waveform remains, and crosses the threshold value again, and the output is inverted. Thus, it is not possible to prevent the output of the comparator 73 from unintentional activation.

In the light receiving circuit 70 according to the fourth embodiment, it is possible to stably generate the undershoot voltage Vus in the output voltage VO1 that is output from the output node 23 of the trans-impedance amplification circuit, regardless of the configuration of a circuit in a subsequent stage. In addition, even though the light receiving circuit 70 according to the fourth embodiment operates at a lower power supply voltage, it is possible for a sufficient electric charge to be charged in the capacitor 34 from the current mirror circuit 5. For this reason, for a wide power supply voltage range including a low voltage operation, a sufficient undershoot is generated at the output node 23, whereby it is possible to prevent the comparator of a subsequent stage from unintended activation. In addition, the light receiving circuit 70 includes the comparator with a specific configuration as a waveform shaping circuit, but the waveform shaping circuit that is used for the light receiving circuit may have other circuits connected to a subsequent stage, regardless of the above-described configuration.

Fifth Embodiment

Figure 10:
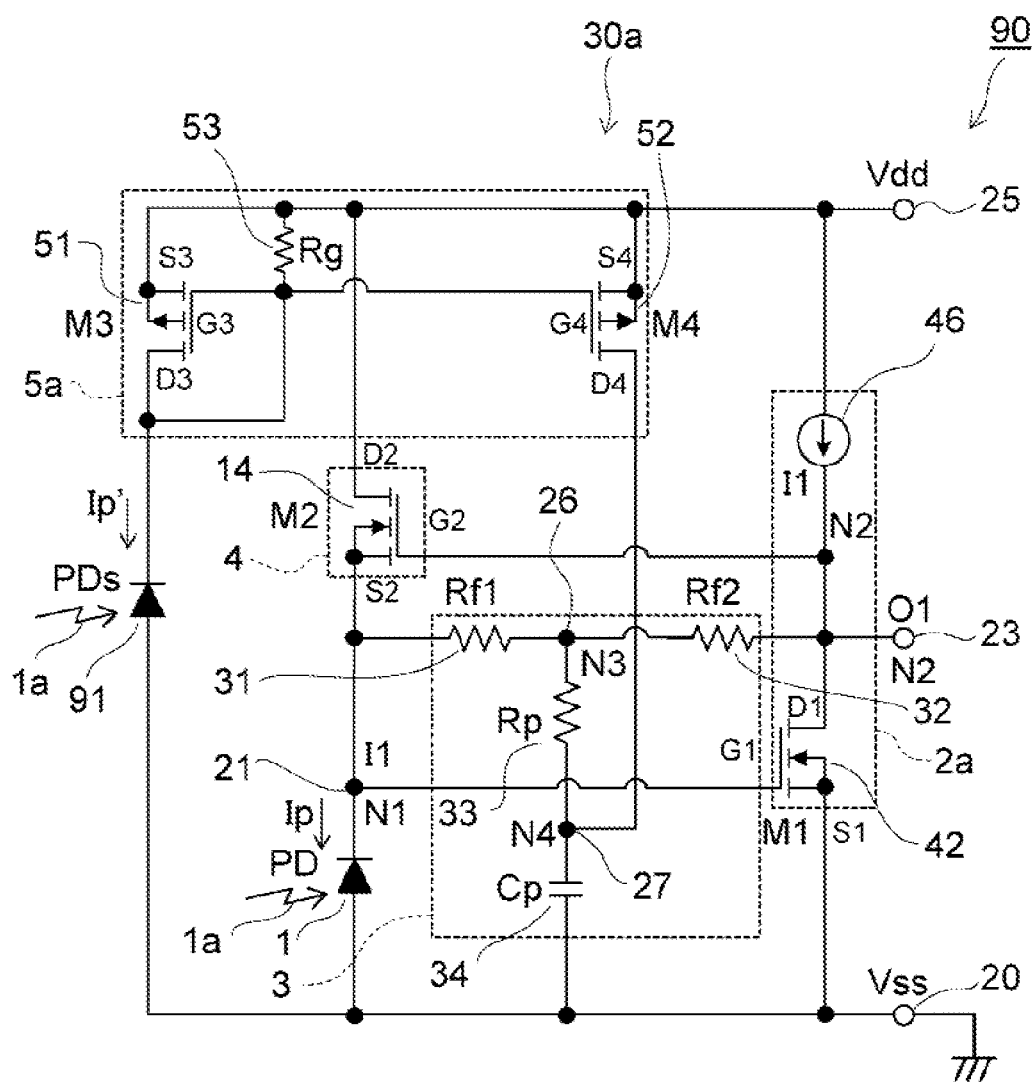
FIG. 10 is a circuit diagram illustrating a light receiving circuit according to a fifth embodiment.

FIG. 10 is a circuit diagram illustrating a light receiving circuit according to a fifth embodiment.

As illustrated in FIG. 10, a light receiving circuit 90 according to the fifth embodiment is different from the light receiving circuit 40 according to the second embodiment in that the light receiving circuit 90 further includes a sub-light receiving element 91 connected to a drain terminal of the reference current setting transistor 51 of the current mirror circuit 5a. Hereinafter, the same symbols or reference numerals as in the light receiving circuit 40 according to the second embodiment are attached to the same circuit elements and connections as in the light receiving circuit 90, and detailed description thereof will be omitted.

The light receiving circuit 90 includes the sub-light receiving element 91. The sub-light receiving element 91 simultaneously receives a light signal 1a, together with the light receiving element 1, and outputs an output current Ip'. The output current Ip' of the sub-light receiving element 91 is substantially proportional to the output current Ip that is output from the light receiving element 1. For this reason, it is preferable that the sub-light receiving element 91 be formed on the same semiconductor substrate on which the light receiving element 1 is formed. The sub-light receiving element 91 is connected between the current mirror circuit 5a and the reference potential 20. The output current of the sub-light receiving element 91 is input to the drain terminal D3 of the reference current setting transistor 51 of the current mirror circuit 5a. A drain terminal D4 of current output transistor 52 of the current mirror circuit 5a is connected to the connection node 27 that is a connection point of the third resistor element 33 and the capacitor 34, in the same manner as in the light receiving circuit 40 according to the second embodiment.

The sub-light receiving element 91 outputs the output current Ip' that is proportional to the output current Ip of the light receiving element 1, whereby the reference current Iref of the current mirror circuit 5a has a current value that is proportional to the output current Ip of the light receiving element 1. The output current Iout that is output from the drain terminal D4 of the current output transistor 52 of the current mirror circuit 5a has a current value that is proportional to the reference current Iref. Thus, the capacitor 34 is charged by the current Iout that is proportional to the output current Ip of the light receiving element 1.

In a case of the light receiving circuit 90, it is possible to control the amount electric charges that are charged in the capacitor 34 for generating the undershoot voltage in proportion to the output current Ip of the light receiving element 1. This control of the charge on the capacitor 34 enables stable generation of the undershoot voltage even under a condition when the limiter circuit 4 does not operate. For example, before the limiter circuit 4 operates, if the amplitude of the output current Ip is relatively small, the trailing current tends to be long under a high temperature condition, but even in such a case, it is possible to realize stable falling by generating the undershoot voltage.

Sixth Embodiment

Figure 11A:
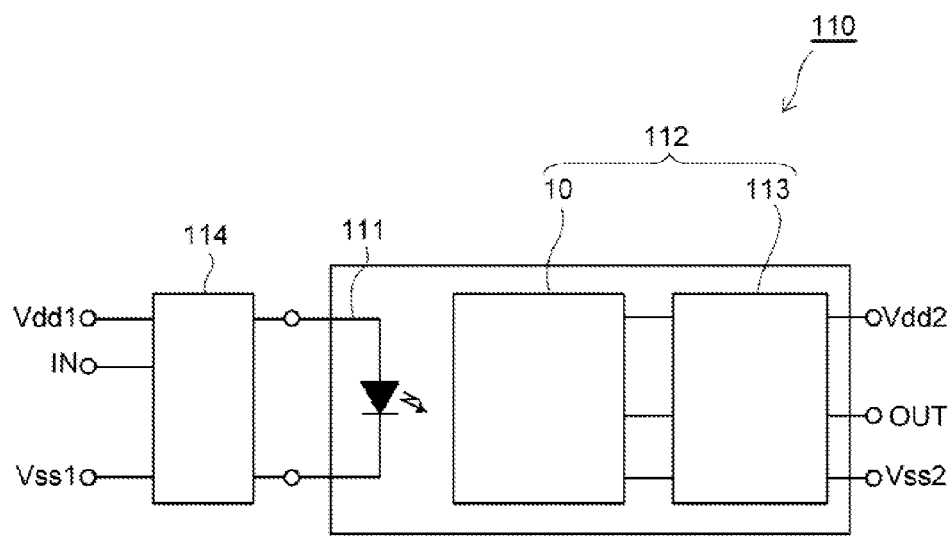
FIG. 11A is a block diagram illustrating a light coupling device according to a sixth embodiment.
Figure 11B:
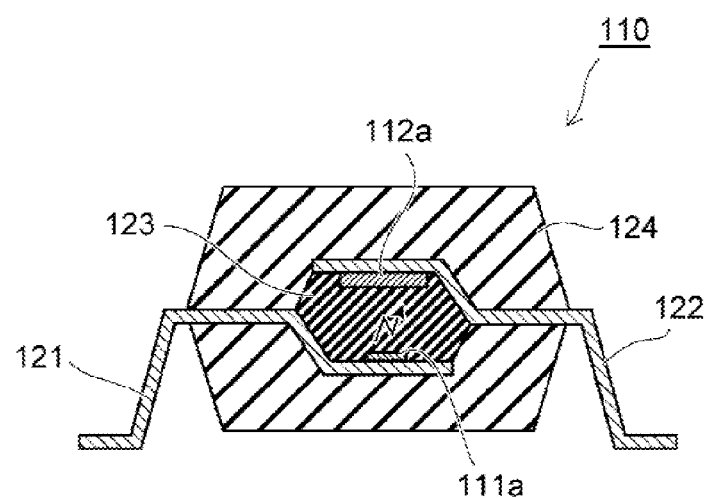
FIG. 11B is a cross-sectional view illustrating a structure of the light coupling device according to the sixth embodiment.

FIG. 11A is a block diagram illustrating a light coupling device according to a sixth embodiment. FIG. 11B is a cross-sectional view illustrating a structure of the light coupling device according to the sixth embodiment.

The light receiving circuits according to the above-described embodiments may be used in conjunction with a light transmitting circuit that transmits a light signal, and may be used for a light coupling device 110. The light coupling device 110 can be used in circumstances where it is difficult to transmit a signal via a direct connection with an electric circuit because a voltage level is significantly different between an input level and an output level. The light coupling device 110 is, for example, a photocoupler.

As illustrated in FIG. 11A, the light coupling device 110 includes a light emitting element 111 and a receiving circuit 112.

The light emitting element 111 can be an infrared light emitting diode including, for example, AlGaAs or the like. The light emitting element 111 is driven by a drive circuit 114. The drive circuit 114 is connected to an external power supply that outputs, for example, voltage Vdd1–Vss1, and a signal is input from a signal input terminal IN. The light emitting element 111 emits light according to the input signal, and thus transmits a light signal to the light receiving circuit 10. Vdd1 is, for example, +5 V, and Vss1 is, for example, –5 V.

Here, the receiving circuit 112 includes the light receiving circuit 10 according to the first embodiment described above. According to a transmission band or other considerations, a light receiving circuit according to another example embodiment may also be used. The light receiving circuit 10 converts the received light signal into a current using the light receiving element 1, converts the current into a voltage using a trans-impedance amplification circuit 30, and outputs the voltage. The receiving circuit 112 may further include a waveform shaping circuit 113 such as the above-described comparator. The waveform shaping circuit 113 is connected to an output of the light receiving circuit 10. The waveform shaping circuit 113, for example, compares an analog voltage signal output from the light receiving circuit 10 with a threshold value to convert the analog voltage signal into a digital signal, and then outputs the digital signal from an output terminal OUT. The light receiving circuit 10 and the waveform shaping circuit 113 are desired to operate using a common power supply, and operation voltages are Vdd2–Vss2. Vdd2 is, for example, 3.3 V, and Vss2 is, for example, 0 V.

As illustrated in FIG. 11B, the light coupling device 110 includes a lead frame 121 on which a light emitting element chip 111a having the light emitting element 111 formed on a semiconductor substrate thereof is mounted and which is connected to the light emitting element chip 111a by bonding wires (not illustrated), and a lead frame 122 on which a receiving circuit chip 112a having the receiving circuit 112 formed on a semiconductor substrate thereof is mounted and which is connected to the receiving circuit chip 112a by bonding wires (not illustrated). The lead frames 121 and 122 are disposed so that surfaces on which the light emitting element chip 111a and the receiving circuit chip 112a are mounted facing each other. Portions of the light emitting element chip 111a and the receiving circuit chip 112a that are disposed to face each other is covered with transparent resin 123 in consideration of light transmission losses. Furthermore, outer circumference portions thereof are sealed with an epoxy-based light-shielding resin 124 by using, for example, a transfer mold technology. The light coupling device 110 is electrically connected to the drive circuit 114 using leads of the lead frame 121 on which the light emitting element chip 111a is mounted, and obtains output signals from leads of the lead frame 122 on which the receiving circuit chip 112a is mounted.

The light coupling device 110 includes the light receiving circuit 10 that may stably operate at a wide band, whereby it is possible to perform the transmission of a signal that is difficult to generate an incorrect output, in a range from a weak signal to a signal with a large amplitude, under an environment that is electrically insulated.

Seventh Embodiment

Figure 12:
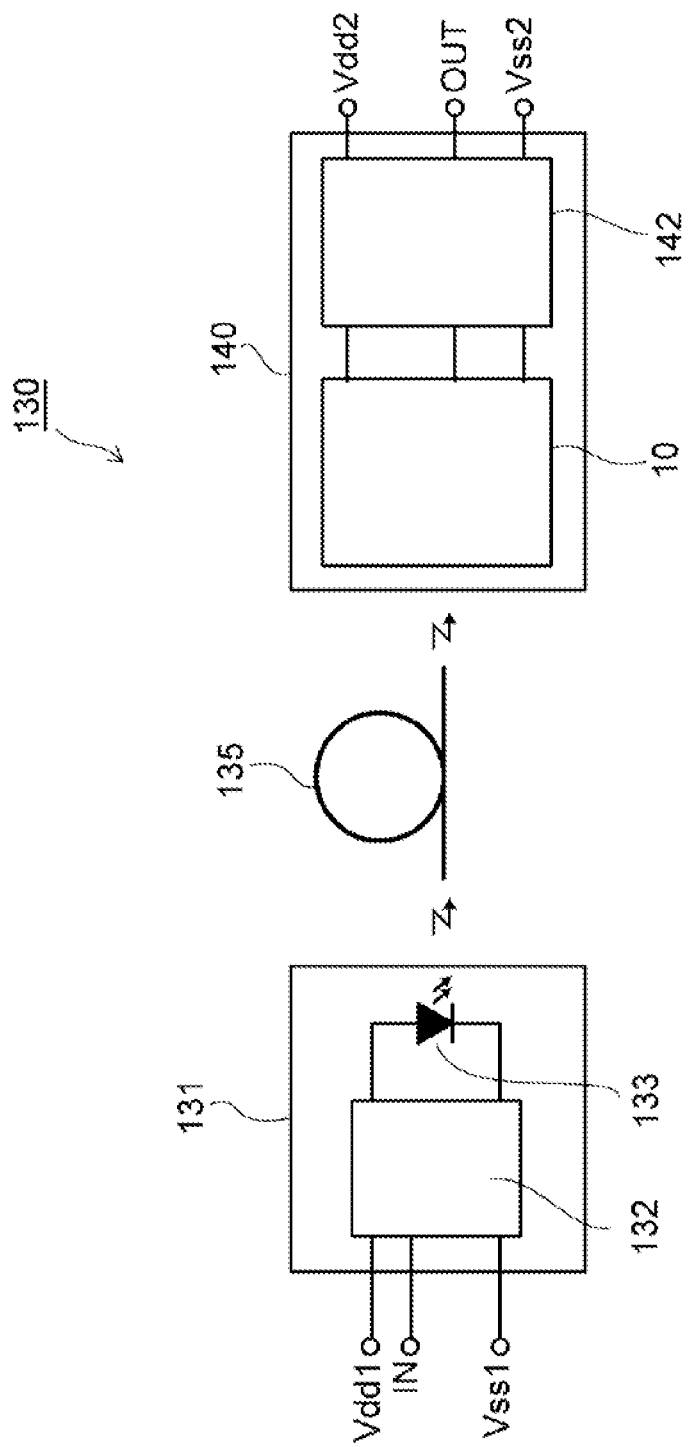
FIG. 12 is a block diagram illustrating a light communication system according to a seventh embodiment.

FIG. 12 is a block diagram illustrating a light communication system according to a seventh embodiment.

The light receiving circuit 10 described above is used together with the transmission circuit that transmits the light signal, and may be used for a light communication system 130. The light communication system 130 receives a light signal that is transmitted via an optical fiber 135, converts the received light signal into an electrical signal, and outputs the electrical signal.

As illustrated in FIG. 12, the light communication system 130 includes a transmission device 131, the optical fiber 135, and a receiving device 140. The transmission device 131 includes a drive circuit 132 and a light emitting element 133 that is driven by the drive circuit 132. The light emitting element 133 of the transmission device 131 is optically coupled to an end portion of the optical fiber 135 and transmits a light signal. The receiving device 140 includes the light receiving circuit 10 and a waveform shaping circuit 142 that converts an analog signal output from the light receiving circuit 10 into a digital signal. The other end portion of the optical fiber 135 is optically coupled to the light receiving element 1 in the light receiving circuit 10 of the receiving device 140, and receives the light signal that is transmitted via the optical fiber 135. The light receiving circuit 10 converts the light signal into an analog electric signal, and outputs the converted electric signal to the waveform shaping circuit 142.

In the light communication system 130 according to the seventh embodiment, it is difficult to generate an incorrect output. The light receiving circuit 10 enables stable operation over a wide band, allowing a wide dynamic range. Thus, it is possible to lengthen a communication distance (e.g., a length of optical fiber 135), and even if there is a large transmission loss, it is possible to receive a light signal using a high gain.

In all the example embodiments described above, a MOSFET is used for a transistor, but in some embodiments at least one (MOSFET) transistor may be replaced with a bipolar transistor. Threshold voltages between the bases and the emitters of the bipolar transistor are intrinsically equal to each other, and it is possible to obtain the same result as that of the above-described embodiments by appropriately setting a transistor size and current density.

In addition, it is possible to use transistors with different polarities by disposing a reference potential on a high potential side and a power supply potential on a low potential side.

According to the example embodiments described above, it is possible to achieve a light receiving circuit and a light coupling device in which it is difficult to generate an incorrect output allowing for stable operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light receiving circuit, comprising:
an inverting amplification circuit having an input terminal and an output terminal;
a first light receiving element connected between the input terminal and a reference potential terminal;
a first resistor and a second resistor connected in series between the input terminal and the output terminal and in parallel with the inverting amplification circuit;
a third resistor connected to a connection node and a connection point that is between the first and second resistors;
a capacitor connected in series with the third resistor and between the connection node and the reference potential terminal; and
a charging circuit connected to the connection node and configured to charge the capacitor.

2. The light receiving circuit according to claim 1, wherein the charging circuit includes a first transistor having a control terminal connected to the output terminal.

3. The light receiving circuit according to claim 2, wherein the charging circuit further includes a current mirror circuit, and the first transistor includes a first main terminal connected to the input terminal and a second main terminal connected to the current mirror circuit.

4. The light receiving circuit according to claim 3, wherein the current mirror circuit is connected to the connection node.

5. The light receiving circuit according to claim 4, wherein the current mirror circuit includes a second transistor and a third transistor that each includes a control terminal connected to the second main terminal of the first transistor.

6. The light receiving circuit according to claim 5, wherein the second transistor and the third transistor each respectively include a first main terminal and a second main terminal, the second transistor has a size that is different from the third transistor, and the connection node is connected to the second main terminal of the third transistor.

7. The light receiving circuit according to claim 3, further comprising:
a comparator connected to the output terminal.

8. The light receiving circuit according to claim 3, further comprising:
a comparator and a level shift circuit, wherein the level shift circuit is connected between the output terminal and an input of the comparator.

9. The light receiving circuit according to claim 3, further comprising:
a second light receiving element connected between the current mirror circuit and the reference potential terminal.

10. The light receiving circuit according to claim 9, wherein the current mirror circuit includes a second transistor and a third transistor that each respectively has a control terminal connected to the second light receiving element.

11. The light receiving circuit according to claim 10, wherein the third transistor includes a first main terminal and a second main terminal connected between the power supply terminal and the connection node.

12. A light receiving circuit, comprising:
a first light receiving element configured to output a first current signal;
an inverting amplification circuit having an input terminal connected to the first light receiving element to receive the first current signal, the inverting amplification circuit is configured to output a voltage signal to an output terminal, the voltage signal corresponding to the first current signal;
a first resistor element and a second resistor element connected in series between the input terminal and the output terminal and in parallel with the inverting amplification circuit;
a third resistor element and a capacitor connected in series between a reference potential and a connection point that is between the first and second resistor elements; and
a charging circuit configured to charge the capacitor by providing a second current signal which is based on the first current signal.

13. The light receiving circuit according to claim 12, wherein the charging circuit includes a first transistor of a first conduction type that includes a control terminal connected to the output terminal, a first main terminal connected to the input terminal, and a second main terminal connected to a power supply potential.

14. The light receiving circuit according to claim 12, wherein the charging circuit includes a current mirror circuit.

15. The light receiving circuit according to claim 12, wherein the inverting amplification circuit includes a source ground amplification circuit.

16. The light receiving circuit according to claim 12, further comprising:
a comparator having a first terminal which is connected to the output terminal and a second terminal that is connected to a reference power supply which outputs a reference voltage.

17. The light receiving circuit according to claim 12, wherein the first transistor is a bipolar transistor.

18. A light coupling device, comprising:
a light emitting element; and
a light receiving circuit comprising:
a power supply terminal and a reference potential terminal;
an inverting amplification circuit having an input terminal and an output terminal;
a first light receiving element connected between the input terminal and the reference potential terminal;
a first resistor and a second resistor connected through a connection point, the first resistor connected between the input terminal and the connection point, and the second resistor connected between the output terminal and the connection point;
a third resistor connected between the connection point and connection node;
a capacitor connected between the connection node and the reference potential terminal; and
a charging circuit connected between the power supply terminal and the connection node, wherein the charging circuit includes a first transistor having a control terminal connected to the output terminal.

19. The light coupling device of claim 18, wherein the light emitting element is disposed on a first lead frame and the first light receiving circuit is disposed on a second lead frame in a facing arrangement with the light emitting element, and the light emitting element and the first light receiving circuit are separated from each other by a transparent resin.

20. The light coupling device of claim 18, further comprising:
a second transistor and a third transistor in the charging circuit, the second and third transistor each of a second conduction type; and
a second light receiving element connected to a control terminal of each of the second and third transistor, wherein the third transistor includes a first main terminal and a second main terminal connected between the power supply terminal and the connection node.

* * * * *